US 7,761,067 B1

(12) United States Patent
Tsai et al.

(10) Patent No.: US 7,761,067 B1
(45) Date of Patent: Jul. 20, 2010

(54) ITERATIVE FILTER CIRCUIT CALIBRATION (75) Inventors: King Chun Tsai, San Jose, CA (US);
Sang Won Son, Sunnyvale, CA (US);
Wayne A. Loeb, San Francisco, CA (US)

(73) Assignee: Marvell International Ltd., Hamilton (BE)

( * ) Notice: Subject to any disclaimer, the term of this patent is extended or adjusted under 35 U.S.C. 154(b) by 1326 days.

(21) Appl. No.: 10/830,117

(22) Filed: Apr. 21, 2004

Related U.S. Application Data

(60) Provisional application No. 60/470,628, filed on May 15, 2003.

(51) Int. Cl.
*H01Q 11/12* (2006.01)
*H04B 1/04* (2006.01)

(52) U.S. Cl. .............. 455/127.2; 455/114.2; 455/115.3; 455/62; 455/266; 455/126; 455/125

(58) Field of Classification Search .................. 455/62, 455/63.1, 67.13, 114.1–115.3, 119–127.4, 455/266
See application file for complete search history.

(56) References Cited

U.S. PATENT DOCUMENTS

| | | | | |
|---|---|---|---|---|
| 3,891,926 A * | 6/1975 | Ishman et al. | ............... | 455/108 |
| 4,459,698 A * | 7/1984 | Yumoto et al. | ............... | 375/236 |
| 4,581,643 A * | 4/1986 | Carlson | ....................... | 348/731 |
| 5,081,713 A * | 1/1992 | Miyazaki | ...................... | 455/76 |
| 5,113,525 A * | 5/1992 | Andoh | ..................... | 455/127.2 |
| 5,155,862 A * | 10/1992 | Hansen | ........................ | 455/266 |
| 5,212,814 A * | 5/1993 | Iwane | ............................ | 455/107 |
| 5,227,743 A * | 7/1993 | Yamamoto | .................. | 333/17.1 |
| 5,281,931 A * | 1/1994 | Bailey et al. | ................. | 333/17.1 |
| 5,392,456 A * | 2/1995 | Mitomo et al. | ......... | 340/825.21 |
| 5,416,441 A * | 5/1995 | Nagano | ....................... | 330/129 |
| 5,499,396 A * | 3/1996 | Reime | ........................ | 455/266 |
| 5,564,095 A * | 10/1996 | Arnstein et al. | .............. | 455/296 |
| 5,917,387 A * | 6/1999 | Rice et al. | ..................... | 333/174 |
| 5,963,856 A * | 10/1999 | Kim | ............................ | 455/307 |
| 6,122,496 A * | 9/2000 | Yoshioka | ..................... | 455/307 |
| 6,141,390 A * | 10/2000 | Cova | ............................ | 375/297 |
| 6,185,262 B1 * | 2/2001 | Brandstetter | ................. | 375/289 |
| 6,212,367 B1 * | 4/2001 | Tolson | ...................... | 455/114.2 |
| 6,307,442 B1 * | 10/2001 | Meyer et al. | ................ | 333/17.1 |
| 6,307,443 B1 * | 10/2001 | Gabara | ....................... | 333/17.1 |
| 6,323,736 B2 | 11/2001 | Jansson | | |
| 6,453,157 B1 * | 9/2002 | Roberts | ....................... | 455/337 |
| 6,545,559 B2 * | 4/2003 | Cullbom et al. | ............. | 333/17.1 |
| 6,549,764 B2 | 4/2003 | Welland | | |
| 6,633,894 B1 * | 10/2003 | Cole | ............................ | 708/300 |
| 6,643,503 B1 * | 11/2003 | Phillips | ....................... | 455/340 |
| 6,766,150 B1 * | 7/2004 | Johnson | ........................ | 455/87 |

(Continued)

OTHER PUBLICATIONS

"Part 16: Air Interface for Fixed Broadband Wireless Access Systems", IEEE 802.16, IEEE Standard for Local and Metropolitan Area Networks, Oct. 1, 2004.

(Continued)

*Primary Examiner*—Edward Urban
*Assistant Examiner*—RuiMeng Hu (57) ABSTRACT

Apparatus, systems, and methods implementing techniques for calibrating a filter circuit. A comparator generates an output based on a filter output amplitude signal and a reference amplitude signal. A calibration logic unit receives the comparator output and produces a component code that is used by the filter circuit to adjust one or more component values.

52 Claims, 9 Drawing Sheets

U.S. PATENT DOCUMENTS

| | | | |
|---|---|---|---|
| 6,778,023 B2* | 8/2004 | Christensen | 331/16 |
| 6,781,474 B2* | 8/2004 | Douziech | 333/17.1 |
| 6,914,437 B2* | 7/2005 | Ibrahim et al. | 324/616 |
| 6,917,252 B1* | 7/2005 | Wyszynski | 333/17.1 |
| 6,922,104 B2* | 7/2005 | Maniwa | 330/149 |
| 6,978,125 B2* | 12/2005 | Lindell et al. | 455/183.1 |
| 6,983,136 B2* | 1/2006 | Mason et al. | 455/307 |
| 7,002,427 B2* | 2/2006 | Nystrom et al. | 333/17.1 |
| 7,039,385 B1* | 5/2006 | Hoffmann et al. | 455/340 |
| 7,177,615 B2* | 2/2007 | Ono | 455/296 |
| 7,184,729 B2* | 2/2007 | Kluge et al. | 455/234.1 |
| 7,359,681 B2* | 4/2008 | Cho | 455/107 |
| 7,400,868 B2* | 7/2008 | Fukusen et al. | 455/150.1 |
| 2002/0058485 A1* | 5/2002 | Nitta | 455/127 |
| 2003/0025563 A1 | 2/2003 | Christensen | |
| 2003/0054783 A1* | 3/2003 | Mason et al. | 455/150.1 |
| 2003/0073419 A1* | 4/2003 | Chadwick | 455/126 |
| 2003/0157907 A1* | 8/2003 | Leinonen et al. | 455/115 |
| 2004/0014439 A1* | 1/2004 | Matsugatani et al. | 455/126 |
| 2004/0097203 A1* | 5/2004 | Folkesson et al. | 455/125 |
| 2004/0137852 A1* | 7/2004 | Shi et al. | 455/73 |
| 2005/0059424 A1* | 3/2005 | Sahota | 455/522 |
| 2005/0123036 A1* | 6/2005 | Rahman et al. | 375/240 |
| 2007/0093218 A1* | 4/2007 | Nagel | 455/114.3 |

OTHER PUBLICATIONS

"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.

"Information technology—Telecommunications and information exchange between systems—Local and metropolitan area networks—Specific requirements- Part 11: Wireless LAN Medium Access Control (MAC) and Physical Layer (PHY) specifications", IEEE Std 802.11, 1999.

"Part 11: Wireless LAN Medium Access Control (MAC) and Physical Layer (PHY) specifications: Higher-Speed Physical Layer Extension in the 2.4 GHz Band", IEEE Std 802.11a, 1999.

"Draft Supplement to Standard [for] Information Technology—Telecommunications and information exchange between systems—Local and metropolitan area networks-Specific requirements—Part 11: Wireless LAN Medium Access Control (MAC) and Physical Layer (PHY) specifications: Further Higher Data Rate Extension in the 2.4 GHz Band", IEEE 802.11g, 2003.

"Part II: Wireless LAN Medium Access Control (MAC) and Physical Layer (PHY) specifications: Higher-Speed Physical Layer Extension in the 2.4 GHz Band", IEEE Std. 802.11b, 1999.

Part 11: Wireless LAN Medium Access Control (MAC) and Physical Layer (PHY) specifications—Amendment 8: Medium Access Control (MAC) Quality of Service Enhancements, IEEE Std. 802.11e, 2005.

"Part 11: Wireless LAN Medium Access Control (MAC) and Physical Layer (PHY) specifications: Amendment 5: Spectrum and Transmit Power Management Extensions in the 6 GHz band in Europe" IEEE Std. 802.11h, 2003.

"Part 11: Wireless LAN Medium Access Control (MAC) and Physical Layer (PHY) specifications: Amendment 6: Medium Access Control (MAC) Security Enhancements, " IEEE Std. 802.11i, 2004.

"TGn Sync Proposal Technical Specification", IEEE Std. 802.11n, 2005.

* cited by examiner

FIG._5

ITERATIVE FILTER CIRCUIT CALIBRATION

CROSS-REFERENCE TO RELATED APPLICATIONS

The present application claims priority to commonly assigned U.S. Provisional Patent Application No. 60/470,628, filed on May 15, 2003, which is incorporated herein by reference in its entirety.

BACKGROUND

The following disclosure relates to electrical circuits and signal processing.

A bandpass filter is a circuit that filters an input signal by significantly attenuating the input signal's frequency components that lie outside a passband while allowing the frequency components that lie within the passband to pass through with relatively less attenuation. Bandpass filter circuits can be characterized by parameters such as a center frequency (the frequency at which the passband of the filter is centered), a bandwidth (the frequency span of the filter passband), and a quality factor (a parameter relating to the ratio of the filter's center frequency to the filter's bandwidth, commonly referred to as the "Q" of the filter).

High quality-factor bandpass filters offer good frequency selectivity, allowing the filters to pass a relatively narrow band of frequencies while attenuating other frequencies. Conventional high quality-factor bandpass filters can be used in wireless transmitters to attenuate unwanted frequencies, such as harmonics of a desired signal, while passing a desired signal. Conventional high quality-factor bandpass filters can also be used in wireless receivers to attenuate unwanted signals (e.g., signals in an image band of the receiver) while passing a desired signal.

One way to implement a bandpass filter at radio frequencies is to use an LC tank circuit. A bandpass filter based on an LC tank circuit may exist in multiple forms. In one form, an inductor is connected in parallel with a capacitor. The filter transfer function in this case is the ratio between the output voltage across the parallel structure and an input current injected into the circuit. In another form, an inductor is connected in series with a capacitor. The filter transfer function in this case is the ratio between the output current flowing through the series structure and an input voltage applied across the circuit.

The center frequency (i.e., the frequency at which the transfer function reaches a local maximum) for a simple LC tank circuit is given by the equation $1/\sqrt{LC}$, where L is the value of the inductor and C is the value of the capacitor. An LC tank circuit typically includes a resistance that affects the quality factor of the LC tank circuit. The resistance can be in the form of a physical resistor connected in parallel with a parallel LC structure, or can be in the form of a physical resistor connected in series with a series LC structure. The resistance can also be a result of loss in the inductor and/or in the capacitor.

When a bandpass filter is implemented monolithically in an integrated circuit, a tradeoff typically exists between the quality factor of the bandpass filter and the tolerance of the bandpass filter to process variations. Conventional CMOS process variations for metal-insulator-metal capacitors can cause variations in capacitance density on the order of ±20% due to factors such as varying dielectric thickness and permittivity. A ±20% variation in capacitance density translates to roughly a ±10% variation in center frequency for a conventional LC tank circuit. As the quality factor of an LC tank circuit increases, the passband of the LC tank circuit grows narrower, and a narrower range of frequency is passed unattenuated. Accordingly, a 10% deviation from the desired center frequency can result in an unacceptably large filter attenuation at the desired center frequency.

In order to compensate for process variations and increase process yields, the quality factor of a filter circuit (e.g., an LC tank circuit) can purposely be reduced to reduce the frequency selectivity of the filter circuit so that variations have less impact on the performance of the filter. This, however, sacrifices filter performance. Filter circuits can also be trimmed individually after processing to compensate for process variations, but individual adjustment increases the cost of manufacturing the filter circuit.

SUMMARY

In one aspect, the invention features an apparatus for calibrating a filter circuit to a desired frequency. A comparator generates an output based on a filter output amplitude signal and a reference amplitude signal, where the filter output amplitude signal corresponds to the amplitude of the output signal produced by the filter circuit. A calibration logic unit receives the comparator output and produces a component code that is used by the filter circuit to adjust one or more component values.

In another aspect, the invention features an apparatus for calibrating a filtering means to a desired frequency. The apparatus includes a comparing means that generates an output based on a filter output amplitude signal and a reference amplitude signal. The filter output amplitude signal corresponds to the amplitude of the output signal produced by the filtering means. The apparatus also includes a code generating means that receives the comparator output and produces a component code that is used by the filtering means to adjust one or more component values.

In one aspect, the invention features a wireless transceiver that includes a transmitter. The transmitter transmits a modulated carrier signal and includes a filter circuit and a calibration circuit to calibrate the filter circuit to a desired frequency. The calibration circuit includes a comparator that generates an output based on a filter output amplitude signal and a reference amplitude signal, where the filter output amplitude signal corresponds to the amplitude of the filter circuit output signal. The calibration circuit also includes a calibration logic unit that receives the comparator output and produces a component code that is used by the filter circuit to adjust one or more component value.

In another aspect, the invention features a wireless transceiver that includes a transmitting means that transmits a modulated carrier signal. The transmitting means includes a filtering means and a calibrating means that calibrates the filtering means to a desired frequency. The calibrating means includes a comparing means that generates an output based on a filter output amplitude signal and a reference amplitude signal. The filter output amplitude signal corresponds to the amplitude of the output signal of the filtering means. The calibrating means also includes a code generating means that receives the comparator output and produces a component code that is used by the filtering means to adjust one or more component values.

In yet another aspect, the invention features a method for calibrating a filter circuit, where the filter circuit receives an input signal and produces a filtered output signal. A comparator output is generated based on a filter output amplitude signal and a reference amplitude signal. The filter output amplitude signal corresponds to the amplitude of the filtered output signal at a desired frequency. A component code is generated based on the comparator output, and one or more component values in the filter circuit are adjusted based on the component code.

Particular implementations may include one or more of the following features. An amplitude detector can receive the filter circuit output signal and generate the filter output amplitude signal based on an amplitude of the filter circuit output signal at the desired frequency. The filter circuit can include an LC tank circuit. The calibration logic unit can include a digital signal processor or a logic circuit, either of which can include the comparator.

The component code can vary a capacitance in the filter circuit, and the capacitance can be monolithically fabricated on a semiconductor substrate. The component code can vary the capacitance by controlling a number of capacitive elements active in the filter circuit. A digital-to-analog converter can receive a digital reference amplitude code and produce the reference amplitude signal. The calibration logic unit can produce the digital reference amplitude code based on the comparator output.

An analog-to-digital converter can receive the filter output amplitude signal and produce a corresponding digital amplitude code. The comparator can use the digital amplitude code as the filter output amplitude signal and can use a stored digital amplitude code as the reference amplitude signal. A DC voltage source can produce the reference amplitude signal, and the calibration logic unit can vary a gain of a variable-gain amplifier based on the comparator output.

The filter circuit can be calibrated to the desired frequency automatically when the filter calibration circuit is connected to a power source. The filter circuit can be calibrated without requiring a reduction in a quality factor of the filter circuit or manual calibration of the filter circuit. The method, apparatus, or system can be compliant with any of IEEE standards 802.11, 802.11a, 802.11b, 802.11e, 802.11g, 802.11h, 802.11i, 802.11n, and 802.16.

Implementations can include one or more of the following advantages. A method, apparatus, and system are disclosed that can be used to calibrate filter circuits with many different types of components. The method, apparatus, and system can use signal sources, mixers, or amplifiers that are necessary elsewhere in a device to calibrate a filter circuit, thereby reducing the size and cost of the device. The method, apparatus, and system can increase semiconductor fabrication process yields by calibrating filter circuits that would be unusable if left uncalibrated. The method, apparatus, and system can improve device performance. The method, apparatus, and system can calibrate a filter circuit during operation of the device and can calibrate a filter without using an external reference signal.

These general and specific aspects may be implemented using an apparatus, a system, a method, or any combination of apparatus, systems, and methods.

The details of one or more implementations are set forth in the accompanying drawings and the description below. Other features and advantages will become apparent from the description, the drawings, and the claims.

DETAILED DESCRIPTION

Figure 1A:
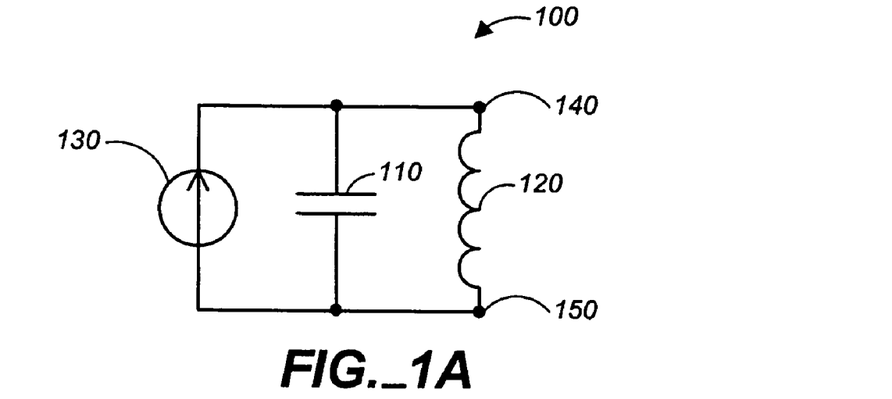
FIG. 1A is a schematic of an LC tank circuit.

FIG. 1A is a schematic of an LC tank bandpass filter circuit 100 (hereafter referred to as LC tank 100). LC tank 100 includes a capacitor 110 and an inductor 120. Capacitor 110 and inductor 120 can be discrete components or can be fabricated monolithically on a semiconductor substrate using a conventional fabrication process. Capacitor 110 can be a variable capacitor, which allows the center frequency of LC tank 100 to be varied. Inductor 120 can be a variable inductor, which also allows the center frequency of LC tank 100 to be varied. LC tank 100 is designed so that the center frequency of LC tank 100 is adjustable over a range of frequencies wide enough to allow LC tank 100 to be calibrated to compensate for process variations (e.g., by using a variable capacitor or a variable inductor). An input current is supplied to LC tank 100 by signal source 130, and an output voltage of LC tank 100 is produced at nodes 140 and 150.

Figure 1B:
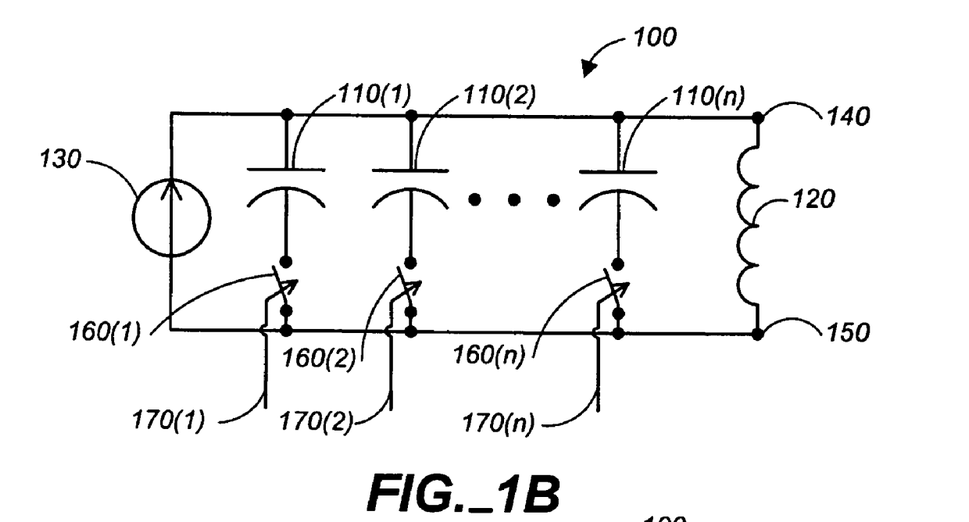
FIG. 1B is a schematic of an LC tank circuit including a capacitor bank.

A variable capacitor (or inductor) can be implemented as an array of individual capacitors (inductors) that can be selectively combined to adjust the overall capacitance (inductance) of LC tank 100. For example, FIG. 1B is a schematic of LC tank 100 where capacitor 110 (from FIG. 1A) is a variable capacitor implemented as a bank of a number n of fixed-value individual capacitors 110(1), 110(2), . . . , 110(n). The capacitance of capacitor 110 is changed by switching any of individual capacitors 110(1), 110(2), . . . , 110(n) into or out of LC tank 100 using switches 160(1), 160(2), . . . , 160(n). Switches 160(1), 160(2), . . . , 160(n) are controlled using control lines 170(1), 170(2), . . . 170(n), which can be driven by a control circuit (not shown) (e.g., a logic circuit). The capacitor array can be partitioned in various ways. For example, in one implementation, all of individual capacitors 110(1), 110(2), . . . , 110(n) have substantially a same capacitance. In another implementation, the capacitance of each of individual capacitors 110(1), 110(2), . . . , 110(n) is set to a value that is binary weighted (e.g., individual capacitor 110(1) can be set to a value k, individual capacitor 110(2) can be set to a value 2k, individual capacitor 110(3) can be set to a value 4k, etc.).

Figure 1C:
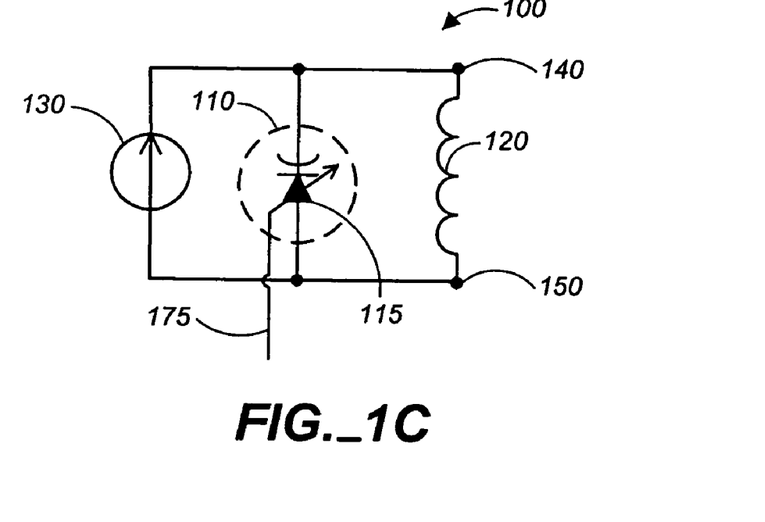
FIG. 1C is a schematic of an LC tank circuit including a varactor.

A variable capacitor can also be implemented using a varactor component, such as a reverse-bias junction diode or a MOS varactor. FIG. 1C is a schematic of LC tank 100 where capacitor 110 (from FIG. 1A) is a variable capacitor implemented as a varactor 115. The value of capacitance of varactor 115 is varied by changing a voltage on a control line 175. The voltage on control line 175 can be varied by a control circuit (not shown) (e.g., a digital-to-analog converter connected to a digital signal processor).

Figure 2:
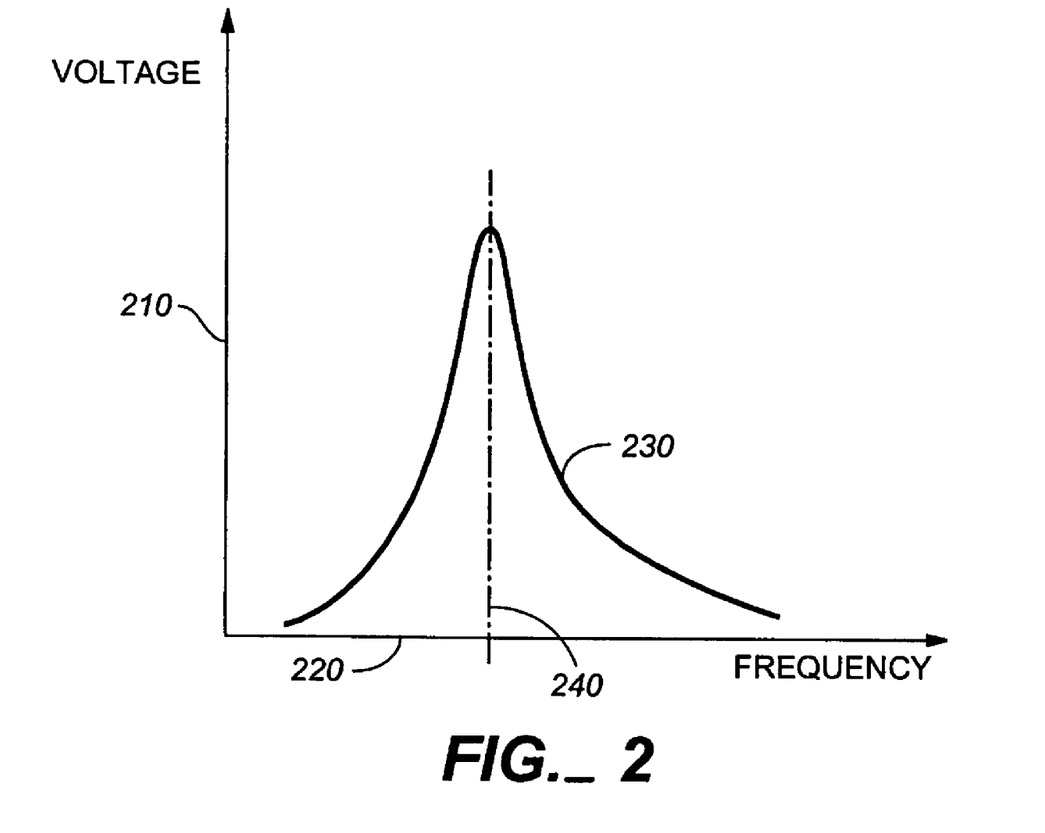
FIG. 2 is a frequency-response graph for an LC tank circuit.

FIG. 2 is an example frequency response graph for LC tank 100 (from FIG. 1A, FIG. 1B, and FIG. 1C), showing the output voltage of LC tank 100 (axis 210) versus the frequency of the input signal (axis 220). Frequency response curve 230 shows that the output voltage of LC tank 100 increases as the frequency of the input signal is increased towards a center frequency 240 of LC tank 100. As the frequency of the input signal is increased beyond center frequency 240, the output voltage of LC tank 100 decreases. Accordingly, LC tank 100 is a bandpass filter that passes signals near center frequency 240, while attenuating other frequencies.

Figure 3A:
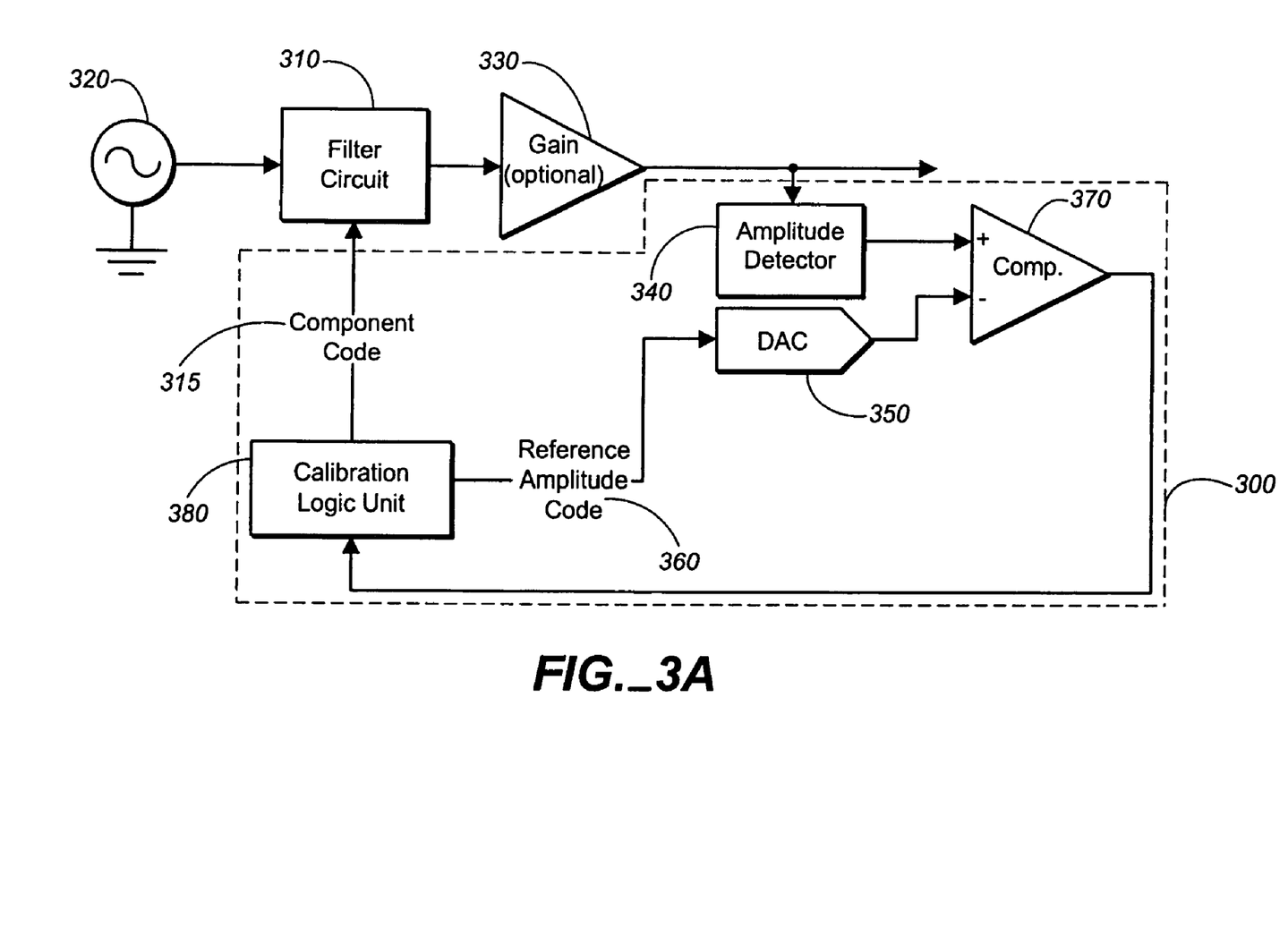
FIG. 3A shows a circuit for calibrating a filter circuit.
Figure 3B:
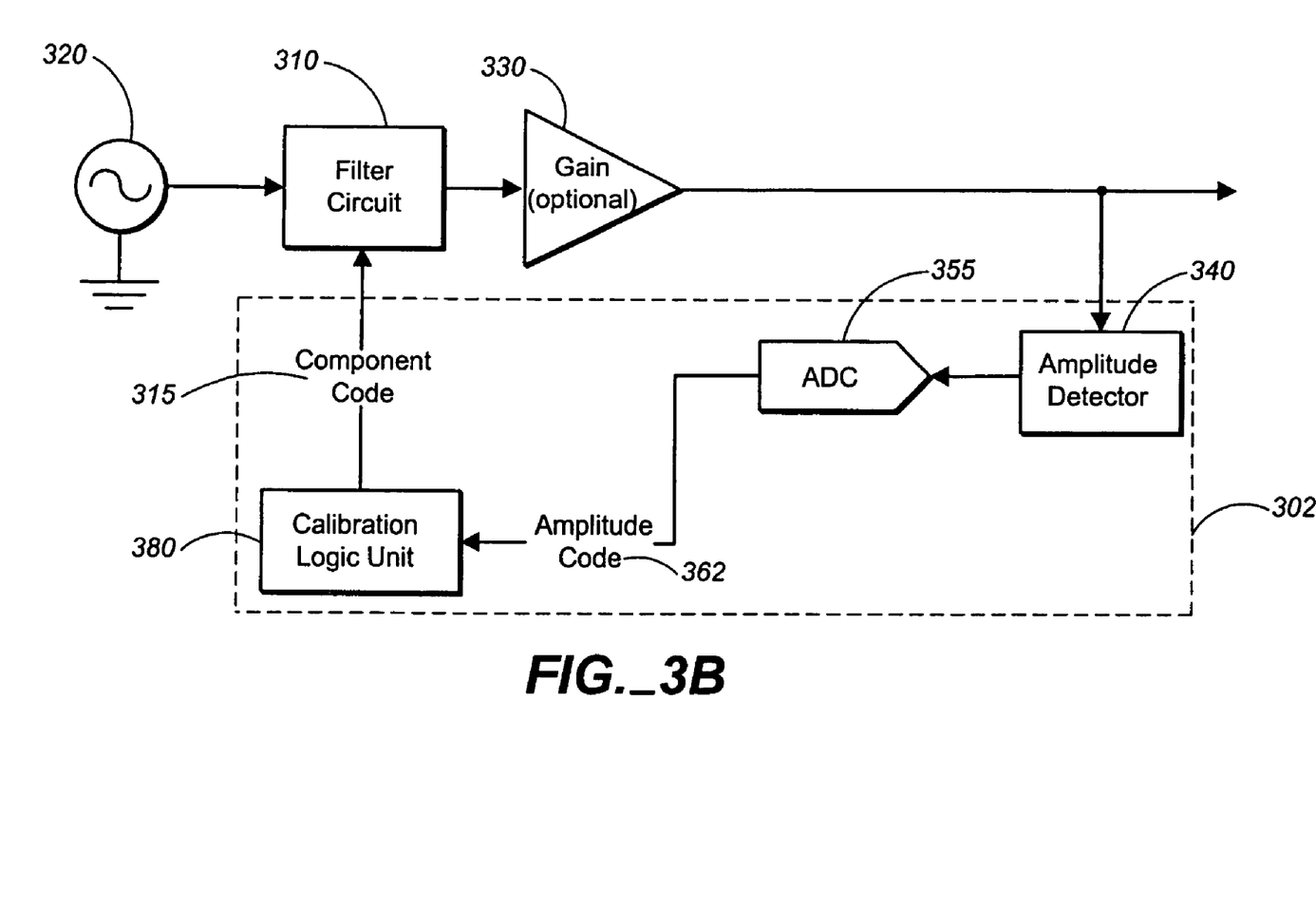
FIG. 3B shows an alternative circuit for calibrating a filter circuit.
Figure 3C:
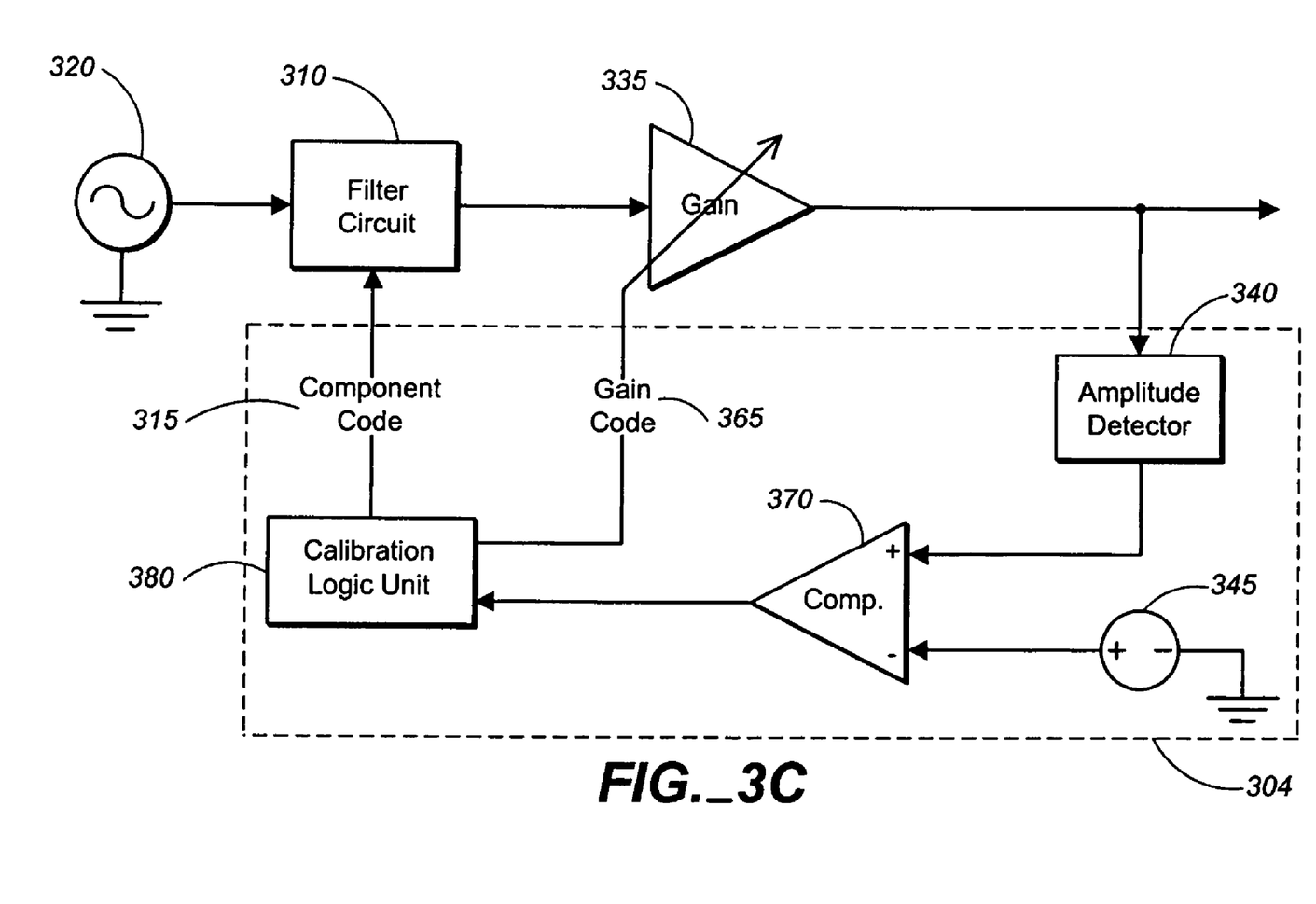
FIG. 3C shows an alternative circuit for calibrating a filter circuit.

LC tank 100 can be calibrated recognizing that the gain of LC tank 100 is greatest at center frequency 240. For example, when a fixed-amplitude input signal at a desired center frequency is applied to LC tank 100, the output amplitude of LC tank 100 will be greatest when LC tank 100 is calibrated such that center frequency 240 matches the frequency of the fixed-amplitude input signal. The fixed-amplitude input signal can be a tone at the desired center frequency or can be a narrow-band signal centered at the desired center frequency whose bandwidth is small relative to the bandwidth of LC tank 100. The calibration technique described above can be implemented in a variety of ways. FIG. 3A, FIG. 3B, and FIG. 3C illustrate three implementations.

FIG. 3A shows a calibration circuit 300 that can be used to calibrate a filter circuit 310 (e.g., LC tank 100 of FIG. 1A, FIG. 1B, or FIG. 1C). Filter circuit 310 has a frequency response including a peak frequency where filter circuit 310 attenuates an input signal the least. Calibration circuit 300 can be used to adjust the peak frequency of filter circuit 310 to a desired frequency by varying a component code 315. The value of one or more components in filter circuit 310 is linked to component code 315. As component code 315 changes, the value of at least one circuit component (e.g., the total capacitance of a capacitor array) changes, which shifts the peak frequency of filter circuit 310.

Changing component code 315 can effect a change in a component value in several different ways. For example, component code 315 can control how much voltage is applied to a varactor (e.g., varactor 115 in FIG. 1C), thus affecting the capacitance in filter circuit 310. Component code 315 can be a digital code that, when translated, results in a voltage being applied to the varactor. Alternatively, component code 315 can control which individual inductors in an array of inductors are connected to filter circuit 310, thus affecting the inductance in filter circuit 310. Component code 315 can also control which individual capacitors in an array of capacitors are connected to filter circuit 310 (e.g., individual capacitors 110(1), 110(2), ..., 110(n) in FIG. 1B).

A signal source 320 provides a reference input at a desired center frequency for filter circuit 310. Signal source 320 can be an oscillator at a fixed frequency. Signal source 320 can be used for other purposes (e.g., if filter circuit 310 is part of a wireless transmitter, a local oscillator in the wireless transmitter can be used as signal source 320). The output of filter circuit 310 is provided to an optional gain stage 330. Gain stage 330 can be a dedicated component that is used only to calibrate filter circuit 310, or gain stage 330 can also have other functions. For example, in a wireless transmitter, an existing amplifier in the signal chain could be used as gain stage 330. Amplitude detector 340 detects the amplitude of the voltage at the output of gain stage 330 (or alternatively at the output of filter circuit 310) and outputs a corresponding voltage. Amplitude detector 340 can be, for example, a peak amplitude detector or an RMS amplitude detector. A digital-to-analog converter (DAC) 350 receives a digital reference amplitude code 360 (hereafter referred to as reference amplitude code 360) as an input and outputs a corresponding analog reference voltage to a comparator 370. When reference amplitude code 360 is incremented, the reference voltage output from DAC 350 is increased.

Comparator 370 compares the voltage output from amplitude detector 340 (which represents the amplitude of the output of filter circuit 310) with the reference voltage output from DAC 350. The output of comparator 370 indicates whether the output voltage of amplitude detector 340 or the reference voltage output from DAC 350 is greater. A calibration logic unit (CLU) 380 uses the output of comparator 370 to adjust component code 315 and reference amplitude code 360. CLU 380 can be a digital signal processor that adjusts component code 315 and reference amplitude code 360 based on a set of programmed instructions. CLU 380 can also be a logic circuit (e.g., a logic circuit implementing a state machine that adjusts component code 315 and reference amplitude code 360 based on the output of comparator 370). In one implementation, two separate CLUs are used—one for component code 315 and one for reference amplitude code 360.

Figure 4A:
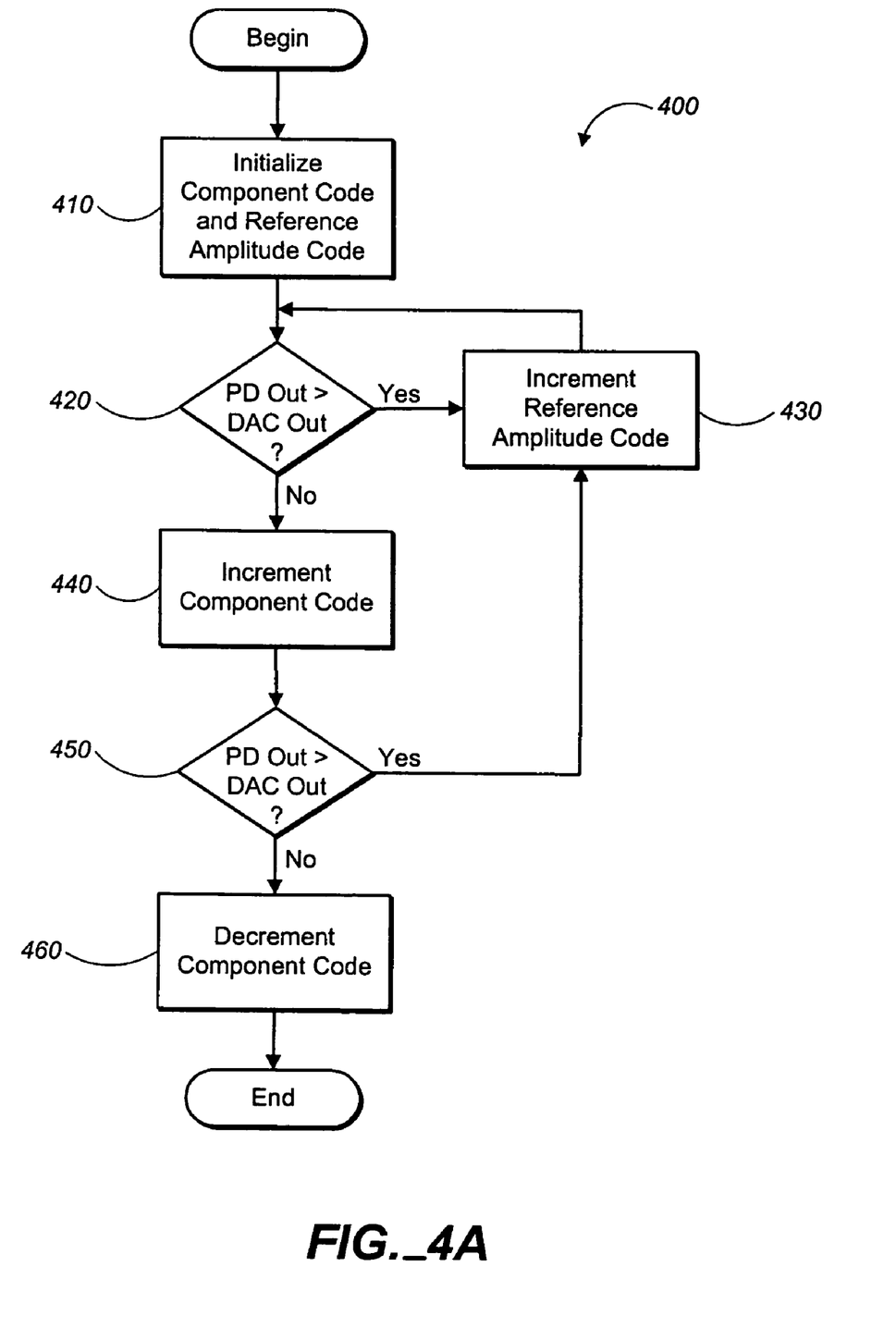
FIG. 4A is a flowchart showing process steps for calibrating a filter circuit using the circuit of FIG. 3A.

Referring to FIG. 3A and FIG. 4A, FIG. 4A shows a method 400 that can be used to calibrate filter circuit 310 using calibration circuit 300. Method 400 begins by initializing reference amplitude code 360 and component code 315 (step 410). In one implementation, reference amplitude code 360 is initialized to a minimum value such that the initial reference voltage output from DAC 350 is less than the filter output amplitude voltage from amplitude detector 340. Component code 315 can be initialized to a value such that the initial peak frequency of filter circuit 310 is above the desired center frequency and can be shifted towards the desired center frequency by monotonically increasing component code 315. After initialization, a determination is made as to whether the output voltage of amplitude detector 340 is greater than the reference voltage output from DAC 350 (step 420). If the output voltage of amplitude detector 340 is greater than the reference voltage, the method continues at step 430. If the output voltage of amplitude detector 340 is less than the reference voltage, the method continues at step 440. In step 430, reference amplitude code 360 is incremented, which increases the reference voltage, and the method returns to step 420.

In step 440, component code 315 is incremented. If incrementing component code 315 moves the peak frequency of filter circuit 310 closer to the desired frequency, the amplitude of the output of filter circuit 310 will increase, so the output voltage of amplitude detector 340 will also increase. If the peak frequency of filter circuit 310 was as close as possible to the desired frequency, incrementing component code 315 will move the peak frequency of filter circuit 310 away from the desired frequency. As the peak frequency of the filter circuit 310 moves away from the desired frequency, the amplitude of the output voltage of filter circuit 310 will decrease, along with the output voltage of amplitude detector 340. A determination is once again made as to whether the output voltage of amplitude detector 340 is greater than the reference voltage output from DAC 350 (step 450). If the output voltage of amplitude detector 340 is greater than the reference voltage, incrementing component code 315 has adjusted the peak frequency closer to the desired frequency, and therefore the current component code is a best code discovered to date (corresponding to the highest filter output amplitude achieved so far). In this case, the method proceeds to step 430 to increase reference amplitude code 360 and thereby increase the reference voltage. The reference voltage thus keeps track of the best amplitude level achieved at the filter output. If, in step 450, the output voltage of amplitude detector 340 is less than the reference voltage, incrementing component code 315 has adjusted the peak frequency beyond the center frequency. If the peak frequency has been adjusted beyond the center frequency, the method decrements the value of component code 315 (step 460) to the component code 315 value from the previous iteration (i.e., the component code 315 value before last being incremented in step 440). The value of component code 315 from the previous iteration is the value for component code 315 that best calibrates the peak frequency of filter circuit 310 to the desired frequency.

FIG. 3B shows another implementation of the calibration technique using a calibration circuit 302. Calibration circuit 302 differs from calibration circuit 300 in that an analog-to-digital converter (ADC) 355 generates a digital amplitude code 362 in response to an analog signal from amplitude detector 340, and CLU 380 uses digital amplitude code 362 to adjust component code 315. DAC 350 and comparator 370, which were used in circuit 300, are not used in circuit 302.

Figure 4B:
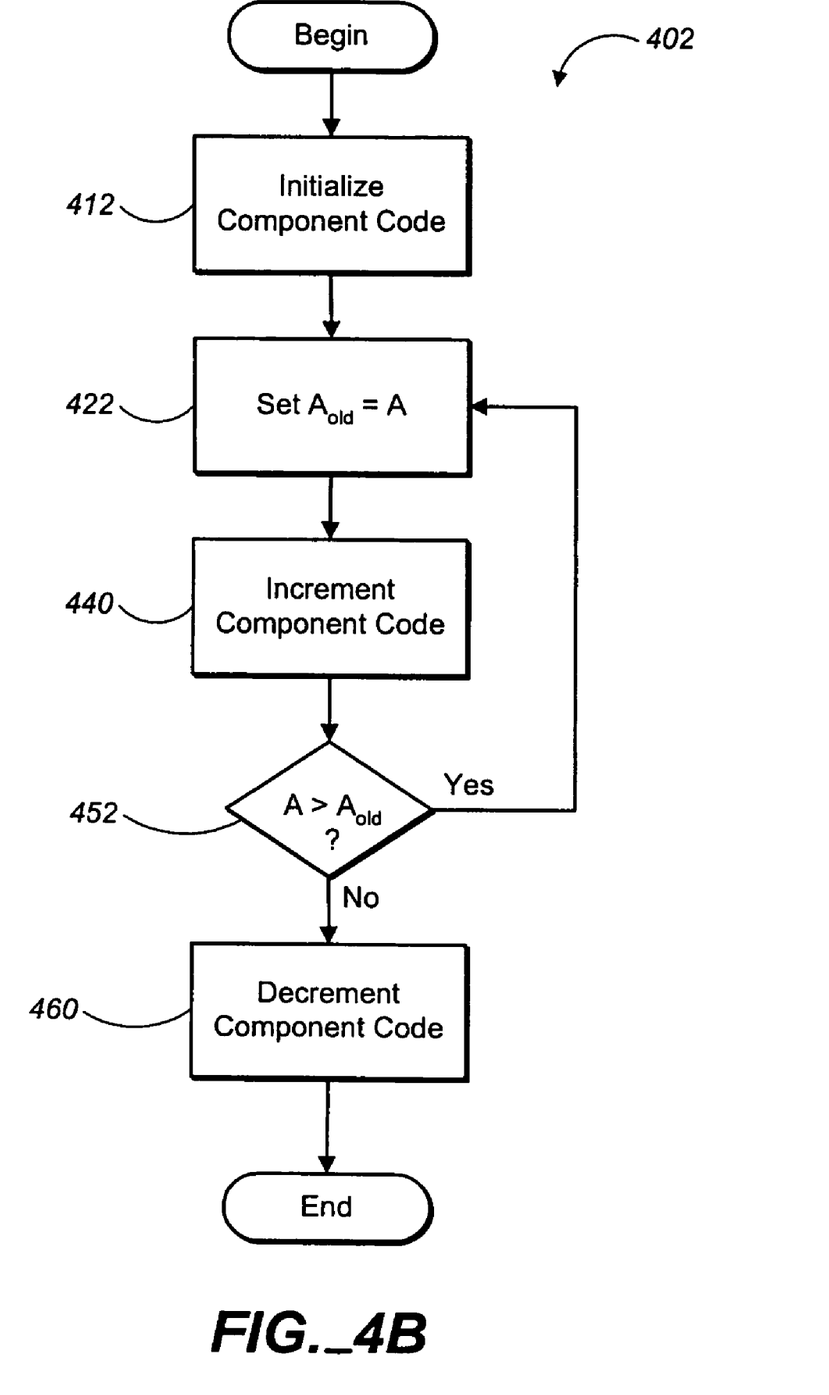
FIG. 4B is a flowchart showing process steps for calibrating a filter circuit using the circuit of FIG. 3B.

Referring to FIG. 3B and FIG. 4B, FIG. 4B shows a method 402 that can be used to calibrate filter circuit 310 using calibration circuit 302. Method 402 begins by initializing component code 315 (step 412). In one implementation, component code 315 can be initialized to a value such that the initial peak frequency of filter circuit 310 can be shifted towards a desired frequency by monotonically increasing component code 315. In one implementation, component code 315 is initialized to the minimum value to which component code 315 can be set. The analog output of amplitude detector 340 is converted into digital amplitude code 362 by ADC 355, and digital amplitude code 362 is stored by CLU 380 (step 422).

In step 440, component code 315 is incremented. A determination is made as to whether the new digital amplitude code 362 provided by ADC 355 is greater than the stored digital amplitude code (step 452). In one implementation, the determination in step 452 is made by a comparator that is part of CLU 380. If the new digital amplitude code 362 is greater than the stored digital amplitude code, incrementing component code 315 has adjusted the peak frequency closer to the desired frequency. In this case, the method continues at step 422 where the method replaces the stored digital amplitude code with the new digital amplitude code 362. The component code and stored digital amplitude code thus respectively keep track of the best filter setting and the maximum filter output amplitude achieved to date. If, in step 452, the new digital amplitude code 362 is less than the stored digital amplitude code, incrementing component code 315 has adjusted the peak frequency beyond the center frequency. In this case, the method decrements the value of component code 315 (step 460) to the component code 315 value from the previous iteration (i.e., the component code 315 value before last being incremented in step 440). The value of component code 315 from the previous iteration is the value for component code 315 that best calibrates the peak frequency of filter circuit 310 to the desired frequency.

FIG. 3C shows a calibration circuit 304 that, like calibration circuit 300, can be used to calibrate a filter circuit 310. Calibration circuit 304 differs from calibration circuit 300 in that gain stage 330 is specifically a variable gain stage 335, comparator 370 compares the output of amplitude detector 340 to a fixed DC reference voltage 345, and CLU 380 generates a gain code 365 that controls the gain of variable gain stage 335. In one implementation, variable gain stage 335 is between signal source 320 and filter circuit 310. DAC 350 and reference amplitude code 360, which were used in circuit 300, are not used in circuit 304.

The implementation shown in FIG. 3C can reuse an existing variable gain amplifier (VGA) in a system as variable gain stage 335. This implementation also reduces hardware costs associated with DAC 350 (FIG. 3A) or ADC 355 (FIG. 3B) in the previously described implementations of the calibration technique. In the implementations shown in FIG. 3A and FIG. 3B, calibration circuits 300 and 302 seek a filter setting that produces the maximum filter output amplitude for a fixed input at a desired center frequency. In the implementation shown in FIG. 3C, calibration circuit 304 seeks a filter setting that requires the least gain from variable gain stage 335 to bring the filter output amplitude up to a given reference level. Because variable gain stage 335 is cascaded with the filter, finding a minimum gain corresponds to maximizing the filter gain at the frequency of the input signal.

Figure 4C:
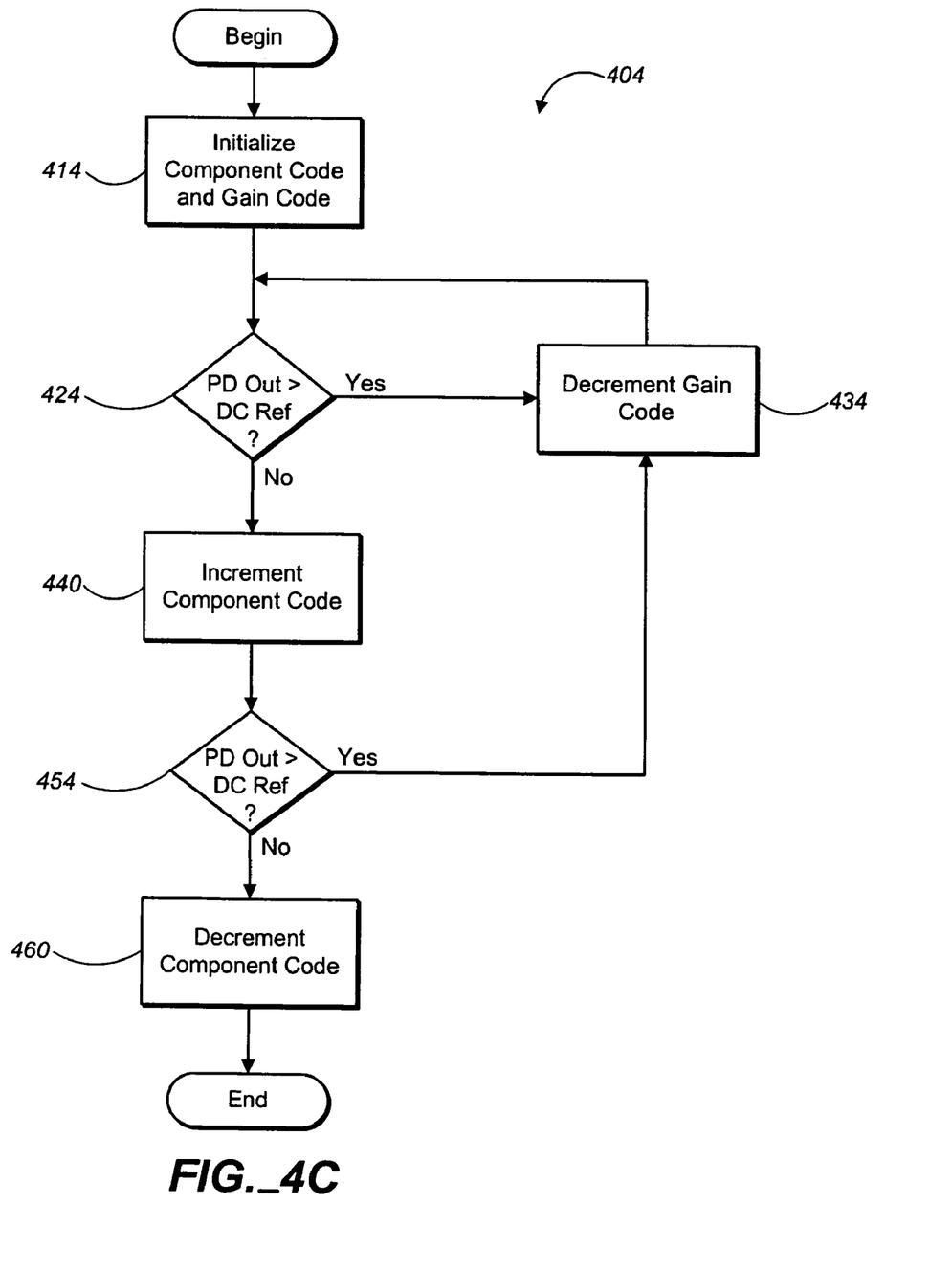
FIG. 4C is a flowchart showing process steps for calibrating a filter circuit using the circuit of FIG. 3C.

Referring to FIG. 3C and FIG. 4C, FIG. 4C shows a method 404 that can be used to calibrate filter circuit 310 using calibration circuit 304. Method 404 begins by initializing component code 315 and gain code 365 (step 414). In one implementation, component code 315 is initialized to a value such that the initial peak frequency of filter circuit 310 can be shifted towards a desired frequency by monotonically increasing component code 315. In one implementation, component code 315 is initialized to the minimum value to which component code 315 can be set, and gain code 365 is initialized to the maximum value to which gain code 365 can be set. Variable gain stage 335 initially is set to a gain such that the output level of amplitude detector 340 is above DC reference voltage 345. Comparator 370 compares the output of amplitude detector 340 to DC reference voltage 345 (step 424). If the output of amplitude detector 340 is greater than DC reference voltage 345, gain code 365 is decremented (step 434). Decrementing gain code 365 decreases the gain of variable gain stage 335, thereby decreasing the output of amplitude detector 340. If, in step 424, the output of amplitude detector 340 is less than DC reference voltage 345, the method continues at step 440.

In step 440, component code 315 is incremented. Comparator 370 again compares the output of amplitude detector 340 to DC reference voltage 345 (step 454). If the output of amplitude detector 340 is now greater than DC reference voltage 345, incrementing component code 315 has adjusted the peak frequency closer to the desired frequency and the method continues at step 434. If, in step 454, the output of amplitude detector 340 is less than DC reference voltage 345, incrementing component code 315 has adjusted the peak frequency beyond the center frequency. If the peak frequency has been adjusted beyond the center frequency, the method decrements the value of component code 315 (step 460) to the component code 315 value from the previous iteration (i.e., the component code 315 value before last being incremented in step 440). The value of component code 315 from the previous iteration is the value for component code 315 that best calibrates the peak frequency of filter circuit 310 to the desired frequency.

In one implementation, in any of steps 410, 412, or 414, component code 315 is initialized to a value such that the initial peak frequency of filter circuit 310 is above the desired center frequency, and incrementing the component code in step 440 shifts the peak frequency of filter circuit 310 towards the desired center frequency. Alternatively, any of methods 400, 402, or 404 can be initialized such that the initial peak frequency of filter circuit 310 is below the desired center frequency, and decrementing component code 315 in step 440 and incrementing component code 315 in step 460 shifts the peak frequency of filter circuit 310 towards the desired center frequency.

Figure 5:
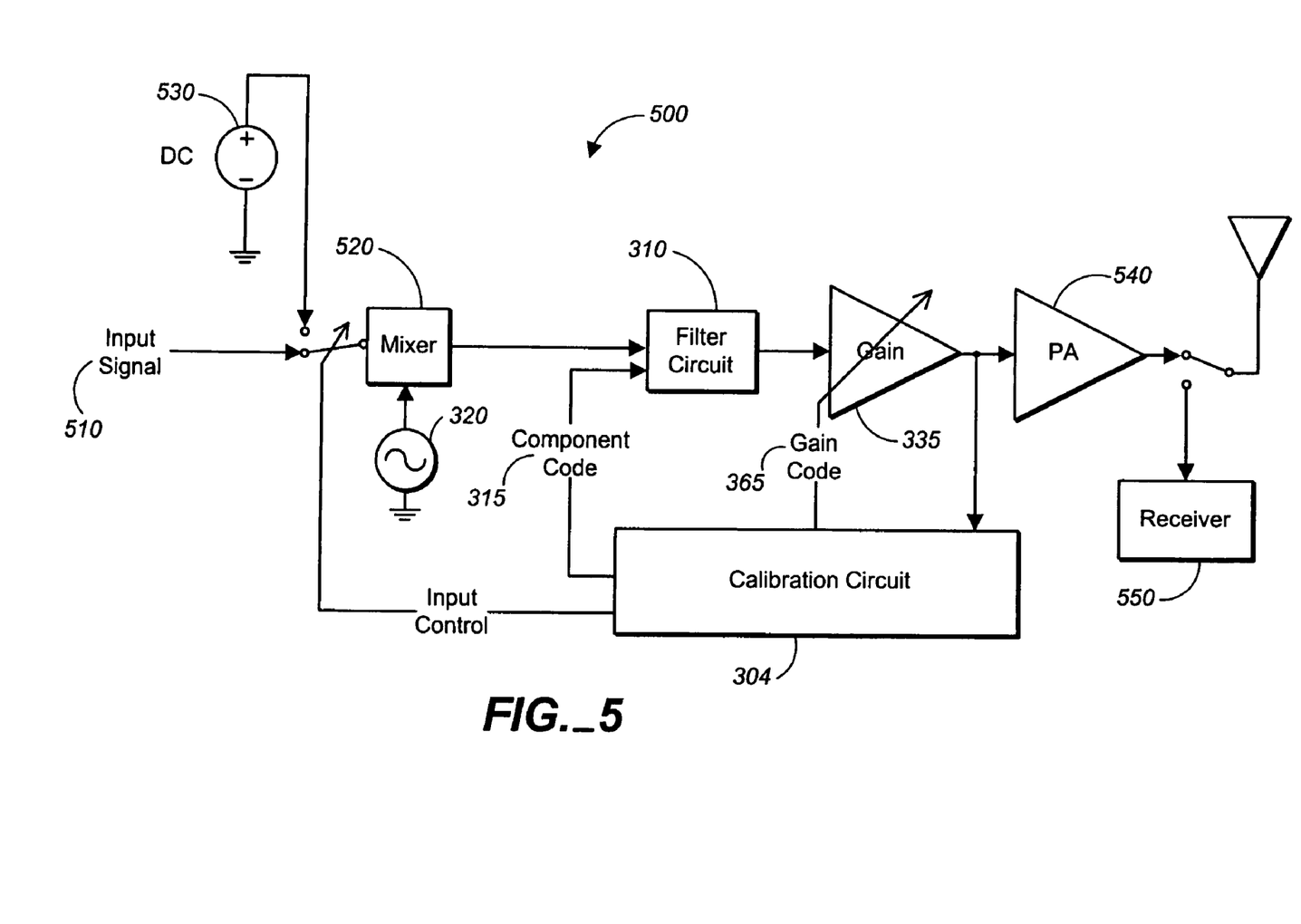
FIG. 5 is a block diagram of a wireless transceiver.
Like reference numbers and designations in the various drawings indicate like elements.

Calibration circuits 300, 302, and 304 can be used in a wide range of applications. Referring to FIG. 5, calibration circuit 304 can be used in a wireless transceiver 500 (hereafter referred to as transceiver 500). In an alternative implementation, calibration circuit 300 or 302 can similarly be used in a wireless transceiver application. The transmit path of transceiver 500 includes a mixer 520 that modulates a signal generated by signal source 320 with a baseband input signal 510. The modulated signal is filtered by filter circuit 310 to attenuate undesired frequencies in the modulated signal. The filtered signal is then amplified by variable gain stage 335 and is further amplified for transmission by power amplifier 540. The receive path of transceiver 500 includes a receiver 550.

Before calibrating filter circuit 310 in transceiver 500, the input of mixer 520 can be switched from baseband input signal 510 to a direct current (DC) source 530, so that no baseband signal reaches mixer 520. Signal source 320 can be set to generate the desired frequency to which filter circuit 310 is to be calibrated, and a tone at the desired frequency will be produced at the output of mixer 520. Calibration circuit 304 can then be used to adjust component code 315 and gain code 365 to calibrate filter circuit 310 as described above in the context of FIG. 3C and FIG. 4C. Power amplifier 540 can be powered down so that no signal is transmitted during calibration. In one implementation, calibration of filter circuit 310 is performed when transceiver 500 is powered up. Transceiver 500 can be IEEE 802 compliant with the following standards: 802.11, 802.11a, 802.11b, 802.11e, 802.11g, 802.11h, 802.11i, 802.11n, and 802.16.

A parallel LC tank was presented as an example of a filter circuit that can be calibrated using the described method and apparatus, but a variety of other filter circuits can be calibrated in a similar manner. For example, the described method can be used to calibrate a notch filter. When a notch filter is calibrated, the component code is varied to search for a minimum (instead of maximum) filter output amplitude at the desired center frequency. The technique can also be adapted to calibrate a multi-resonant filter (e.g., a filter with multiple peaks or notches in frequency response). The peak or notch frequencies can be calibrated in sequence if the multi-resonant filter is implemented so that multiple resonant frequencies can be adjusted individually by varying the values of different variable components.

In some implementations, a filter circuit is calibrated by decreasing the component code monotonically. The method and apparatus can be modified so that the center frequency of a peak or notch in the frequency response of the filter is initialized to be higher than a desired frequency, and the component code can be adjusted to decrease the frequency of the peak or notch.

Various implementations have been described. These and other implementations are within the scope of the following claims. For example, the steps of the methods described above can be performed in a different order and still achieve desirable results.

What is claimed is:

1. A filter calibration circuit, consisting of:
   a DC voltage source operable to produce a reference amplitude signal;
   an amplitude detector configured to receive an output signal from a variable gain stage and produce an amplitude signal, wherein the output signal from the variable gain stage is produced by modifying an amplitude of an output signal produced by a filter circuit, which comprises capacitive components to be calibrated to a desired frequency;
   a comparator operable to generate a comparator output based on the amplitude signal of the amplitude detector and the reference amplitude signal of the DC voltage source; and
   a calibration logic unit, separate from the comparator, operable to
   receive the comparator output,
   produce a digital gain code based on the comparator output to adjust a gain of the variable gain stage, and
   produce a digital component code corresponding to switches associated with the capacitive components in the filter circuit to be used by the filter circuit in adjusting a combined value of the capacitive components in the filter circuit by selectively turning on or off one or more of the switches associated with the capacitive components to control a number of the capacitive components active in the filter circuit to calibrate the filter circuit to the desired frequency.

2. The filter calibration circuit of claim 1, wherein:
the filter circuit includes an LC tank circuit.

3. The filter calibration circuit of claim 1, wherein:
the calibration logic unit includes a digital signal processor.

4. The filter calibration circuit of claim 3, wherein:
the digital signal processor includes the comparator.

5. The filter calibration circuit of claim 1, wherein:
the calibration logic unit includes a logic circuit.

6. The filter calibration circuit of claim 5, wherein:
the logic circuit includes the comparator.

7. The filter calibration circuit of claim 1, wherein:
the capacitive components are monolithically fabricated on a semiconductor substrate.

8. The filter calibration circuit of claim 1, wherein:
the filter calibration circuit is operable to calibrate the filter circuit to the desired frequency automatically when the filter calibration circuit is connected to a power source.

9. The filter calibration circuit of claim 1, wherein:
the filter calibration circuit is operable to calibrate the filter circuit to the desired frequency without requiring a reduction in a quality factor of the filter circuit.

10. The filter calibration circuit of claim 1, wherein:
the filter calibration circuit is operable to calibrate the filter circuit to the desired frequency without requiring manual calibration of the filter circuit.

11. The filter calibration circuit of claim 1, wherein:
the filter calibration circuit is compliant with any of IEEE standards 802.11, 802.11a, 802.11b, 802.11e, 802.11g, 802.11h, 802.11i, 802.11n, and 802.16.

12. A filter calibration circuit, consisting of:
means for sourcing a reference amplitude signal;
an amplitude detector means for receiving an output signal from a variable gain stage and producing an amplitude signal, wherein the output signal from the variable gain stake is produced by modifying an amplitude of an output signal produced by a filter circuit, which comprises capacitive components to be calibrated to a desired frequency;
comparing means for generating a comparator output based on the amplitude signal of the amplitude detector means and the reference amplitude signal of the means for sourcing a reference amplitude signal; and
code generating means, separate from the comparing means, for
receiving the comparator output,
producing a digital gain code based on the comparator output to adjust a gain of the variable gain stage, and
producing a digital component code corresponding to switching means associated with the capacitive means to be used by the filtering means in adjusting a combined value of the capacitive component means in the filtering means by selectively turning on or off one or more of the switching means associated with the capacitive means to control a number of the capacitive means active in the filtering means to calibrate the filtering means to the desired frequency.

13. The filter calibration circuit of claim 12, wherein:
the filtering means includes an LC tank circuit means.

14. The filter calibration circuit of claim 12, wherein:
the code generating means includes a digital signal processing means.

15. The filter calibration circuit of claim 14, wherein:
the digital signal processing means includes the comparing means.

16. The filter calibration circuit of claim 12, wherein:
the code generating means includes a logic circuit means.

17. The filter calibration circuit of claim 16, wherein:
the logic circuit means includes the comparing means.

18. The filter calibration circuit of claim 12, wherein:
the capacitive means are monolithically fabricated on a semiconductor substrate.

19. The filter calibration circuit of claim 12, wherein:
the filter calibration circuit is operable to calibrate the filtering means to the desired frequency automatically when the filter calibration circuit is connected to a power source means.

20. The filter calibration circuit of claim 12, wherein:
the filter calibration circuit is operable to calibrate the filtering means to the desired frequency without requiring a reduction in a quality factor of the filtering means.

21. The filter calibration circuit of claim 12, wherein:
the filter calibration circuit is operable to calibrate the filtering means to the desired frequency without requiring manual calibration of the filtering means.

22. The filter calibration circuit of claim 12, wherein:
the filter calibration circuit is compliant with any of IEEE standards 802.11, 802.11a, 802.11b, 802.11e, 802.11g, 802.11h, 802.11i, 802.11n, and 802.16.

23. A method for calibrating a filter circuit, which comprises capacitive components, the filter circuit receiving an input signal and producing a filtered output signal, the method comprising:
initializing a digital component code corresponding to switches associated with capacitive components in the filter circuit to a value such that an initial peak frequency of the filter circuit is below or above a desired frequency;
initializing a digital gain code to a value such that a modified filtered output signal produced by a variable gain stage is greater than a DC reference voltage, wherein the variable gain stage is modifying the filtered output signal based on the initialized digital gain code;
producing an amplitude signal corresponding to the modified filtered output signal produced by the variable gain stage modifying the filtered output signal based on the digital gain code;
generating a comparator output based on the amplitude signal and the DC reference voltage; and
adjusting the digital gain code and the digital component code in combination until the comparator output indicates that the filter circuit is calibrated at the desired frequency;
wherein adjusting the digital component code adjusts a combined value of the capacitive components in the filter circuit by selectively turning on or off one or more of the switches associated with the capacitive components to control a number of the capacitive components active in the filter circuit to calibrate the filter circuit at the desired frequency.

24. The method of claim 23, wherein:
generating the comparator output includes digitally generating the comparator output.

25. The method of claim 23, wherein:
adjusting the combined value of the capacitive components comprises turning on or off one or more of the switches associated with the capacitive components monolithically fabricated on a semiconductor substrate.

26. The method of claim 23, further comprising:
calibrating the filter circuit automatically when the filter circuit is connected to a power source.

27. The method of claim 23, further comprising:
calibrating the filter circuit without requiring a reduction in a quality factor of the filter circuit.

28. The method of claim 23, further comprising:
calibrating the filter circuit without requiring manual calibration of the filter circuit.

29. The method of claim 23, wherein:
the method is compliant with any of IEEE standards 802.11, 802.11a, 802.11b, 802.11e, 802.11g, 802.11h, 802.11i, 802.11n, and 802.16.

30. The method of claim 23, wherein adjusting the digital gain code and the digital component code in combination until the comparator output indicates that the filter circuit is calibrated at the desired frequency comprises:
decrementing a value of the digital gain code from the initialized value until the comparator output indicates that the amplitude signal is less than the DC reference voltage;
incrementing a value of the digital component code;
returning to the decrementing of the value of the digital gain code when the comparator output indicates that the amplitude signal is greater than the reference voltage; and
decrementing the value of the digital component code when the comparator output indicates that the amplitude is less than the reference voltage after the incrementing the value of the digital component code.

31. A wireless transceiver, comprising:
a transmitter operable to transmit a modulated carrier signal, the transmitter including
a filter circuit, which comprises capacitive components, operable to filter the modulated carrier signal and produce a filter output signal;
a variable gain stage to adjust an amplitude of the filter output signal; and
a calibration circuit operable to calibrate the filter circuit to a desired frequency and adjust a gain of the variable gain stage to adjust the amplitude of the filter output signal, the calibration circuit consisting of:
a DC voltage source operable to produce a reference amplitude signal;
an amplitude detector to receive an output signal from the variable gain stage and produce an amplitude signal;
a comparator operable to generate a comparator output based on the amplitude signal of the amplitude detector and the reference amplitude signal of the DC voltage source; and
a calibration logic unit, separate from the comparator, operable to
receive the comparator output
produce a digital gain code based on the comparator output to adjust a gain of the variable gain stage, and
produce a digital component code corresponding to switches associated with the capacitive components in the filter circuit to be used by the filter circuit in adjusting a combined value of the capacitive components in the filter circuit by selectively turning on or off one or more of the switches associated with the capacitive components to control a number of the capacitive components active in the filter circuit to calibrate the filter circuit to the desired frequency.

32. The wireless transceiver of claim 31, wherein:
the filter circuit includes an LC tank circuit.

33. The wireless transceiver of claim 31, wherein:
the calibration logic unit includes a digital signal processor.

34. The wireless transceiver of claim 33, wherein:
the digital signal processor includes the comparator.

35. The wireless transceiver of claim 31, wherein:
the calibration logic unit includes a logic circuit.

36. The wireless transceiver of claim 35, wherein:
the logic circuit includes the comparator.

37. The wireless transceiver of claim 31, wherein:
the capacitive components are monolithically fabricated on a semiconductor substrate.

38. The wireless transceiver of claim 31, wherein:
the calibration circuit is operable to calibrate the filter circuit to the desired frequency automatically when the calibration circuit is connected to a power source.

39. The wireless transceiver of claim 31, wherein:
the calibration circuit is operable to calibrate the filter circuit to the desired frequency without requiring a reduction in a quality factor of the filter circuit.

40. The wireless transceiver of claim 31, wherein:
the calibration circuit is operable to calibrate the filter circuit to the desired frequency without requiring manual calibration of the filter circuit.

41. The wireless transceiver of claim 31, wherein:
the wireless transceiver is compliant with any of IEEE standards 802.11, 802.11a, 802.11b, 802.11e, 802.11g, 802.11h, 802.11i, 802:11n, and 802.16.

42. A wireless transceiver, comprising:
transmitting means for transmitting a modulated carrier signal, the transmitting means including
  a filtering means, which comprises capacitive means for filtering the modulated carrier signal and producing a filter output signal;
  a variable gain stage means for adjusting an amplitude of the filter output signal; and
  calibrating means for calibrating the filtering means to a desired frequency and adjusting a gain of the variable gain stage to adjust the amplitude of the filter output signal, the calibrating means consisting of:
    means for sourcing a reference amplitude signal,
    an amplitude detector means for receiving an output signal from the variable gain stage and produce an amplitude signal,
    comparing means for generating a comparator output based on the amplitude signal of the amplitude detector means and the reference amplitude signal of the means for sourcing a reference amplitude signal, and
    code generating means, separate from the comparing means, for
      receiving the comparator output,
      producing a digital gain code based on the comparator output to adjust a gain of the variable gain stage means, and
      producing a digital component code corresponding to switching means associated with the capacitive means in the filtering means to be used by the filtering means in adjusting a combined value of the capacitive means in the filtering means, by selectively turning on or off one or more of the switching means associated with the capacitive means to control a number of the capacitive means active in the filtering means to calibrate the filtering means to the desired frequency.

43. The wireless transceiver of claim 42, wherein:
the filtering means includes an LC tank circuit means.

44. The wireless transceiver of claim 42, wherein:
the code generating means includes a digital signal processing means.

45. The wireless transceiver of claim 44, wherein:
the digital signal processing means includes the comparing means.

46. The wireless transceiver of claim 42, wherein:
the code generating means includes a logic circuit means.

47. The wireless transceiver of claim 46, wherein:
the logic circuit means includes the comparing means.

48. The wireless transceiver of claim 42, wherein:
the capacitive means are monolithically fabricated on a semiconductor substrate.

49. The wireless transceiver of claim 42, wherein:
the calibrating means is operable to calibrate the filtering means to the desired frequency automatically when the calibrating means is connected to a power source means.

50. The wireless transceiver of claim 42, wherein:
the calibrating means is operable to calibrate the filtering means to the desired frequency without requiring a reduction in a quality factor of the filtering means.

51. The wireless transceiver of claim 42, wherein:
the calibrating means is operable to calibrate the filtering means to the desired frequency without requiring manual calibration of the filtering means.

52. The wireless transceiver of claim 42, wherein:
the wireless transceiver is compliant with any of IEEE standards 802.11, 802.11x, 802.11b, 802.11e, 802.11g, 802.11h, 802.11i, 802.11n, and 802.16.

* * * * *